(12) United States Patent
Igarashi et al.

(10) Patent No.: US 9,964,579 B2
(45) Date of Patent: May 8, 2018

(54) VOLTAGE DETECTION APPARATUS

(71) Applicant: Hitachi Automotive Systems, Ltd., Hitachinaka-shi, Ibaraki (JP)

(72) Inventors: Hiroaki Igarashi, Hitachinaka (JP); Masayoshi Kashihara, Hitachinaka (JP); Tatsuya Hatakeyama, Hitachinaka (JP); Koichi Yahata, Hitachinaka (JP); Hideyuki Sakamoto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days. days.

(21) Appl. No.: 15/312,085

(22) PCT Filed: Jun. 17, 2015

(86) PCT No.: PCT/JP2015/067388
§ 371 (c)(1),
(2) Date: Nov. 17, 2016

(87) PCT Pub. No.: WO2016/017309
PCT Pub. Date: Feb. 4, 2016

(65) Prior Publication Data
US 2017/0089969 A1 Mar. 30, 2017

(30) Foreign Application Priority Data
Aug. 1, 2014 (JP) .................. 2014-157291

(51) Int. Cl.
*G01R 31/02* (2006.01)
*G01R 31/40* (2014.01)
*G01R 15/04* (2006.01)

(52) U.S. Cl.
CPC ............. *G01R 31/02* (2013.01); *G01R 15/04* (2013.01); *G01R 31/40* (2013.01)

(58) Field of Classification Search
CPC .......... G01R 31/00–31/06; G01R 31/40; G01R 15/04; G01R 19/165; G01R 27/00–27/32; H02M 7/48

(Continued)

(56) References Cited

U.S. PATENT DOCUMENTS 6,288,881 B1 * 9/2001 Melvin ................. H02J 7/1461
361/104
6,984,988 B2 * 1/2006 Yamamoto ............ B60L 3/0023
324/503

(Continued)

FOREIGN PATENT DOCUMENTS

JP     2003-329720 A     11/2003
JP     2003329720 A  *  11/2003

(Continued)

OTHER PUBLICATIONS

International Search Report (PCT/ISA/210) issued in PCT Application No. PCT/JP2015/067388 dated Jul. 28, 2015 with English translation (3 pages).

(Continued)

*Primary Examiner* — Patrick Assouad
*Assistant Examiner* — Sean Curtis
(74) *Attorney, Agent, or Firm* — Crowell & Moring LLP

(57) ABSTRACT

An object of the present invention is to diagnose a state of a voltage divider while performing a normal measurement to improve reliability. A voltage detection apparatus according to the present invention includes: a first resistor for dividing voltage of a detection unit into a first divided voltage value; and a test pattern insertion circuit unit including a second resistor for dividing the first divided voltage value into a second divided voltage value and a switching device, wherein the test pattern insertion circuit unit is connected to an equipotential connection point to the first divided voltage (Continued)

value, and wherein a state of the first resistor is detected based on the second divided voltage value when the switching device is conductive.

9 Claims, 11 Drawing Sheets

(58) Field of Classification Search
USPC .................................................. 324/522, 549
See application file for complete search history.

(56) References Cited

U.S. PATENT DOCUMENTS

| 8,174,802 | B2* | 5/2012 | Abe | ..................... | H02M 1/32 |
| | | | | | 361/18 |
| 8,232,806 | B2* | 7/2012 | Kawamura | ........... | B60L 3/0023 |
| | | | | | 324/503 |
| 8,373,424 | B2* | 2/2013 | Kawamura | .......... | G01R 31/028 |
| | | | | | 324/503 |
| 8,878,543 | B2* | 11/2014 | Morimoto | ............. | B60L 3/0069 |
| | | | | | 324/503 |
| 2012/0212871 | A1* | 8/2012 | Taniguchi | .......... | G01R 31/3624 |
| | | | | | 361/87 |
| 2015/0291088 | A1* | 10/2015 | Ueno | ....................... | H02M 7/48 |
| | | | | | 315/77 |
| 2016/0094056 | A1* | 3/2016 | Dulle | ...................... | H02J 7/007 |
| | | | | | 320/126 |
| 2017/0089969 | A1* | 3/2017 | Igarashi | .................. | G01R 31/02 |
| 2017/0254842 | A1* | 9/2017 | Bahl | ................... | G01R 15/04 |

FOREIGN PATENT DOCUMENTS

| JP | 2005-117756 A | 4/2005 |
| WO | WO 2011/148592 A1 | 12/2011 |

OTHER PUBLICATIONS

Japanese-language Written Opinion (PCT/ISA/237) issued in PCT Application No. PCT/JP2015/067388 dated Jul. 28, 2015 (3 pages).

* cited by examiner

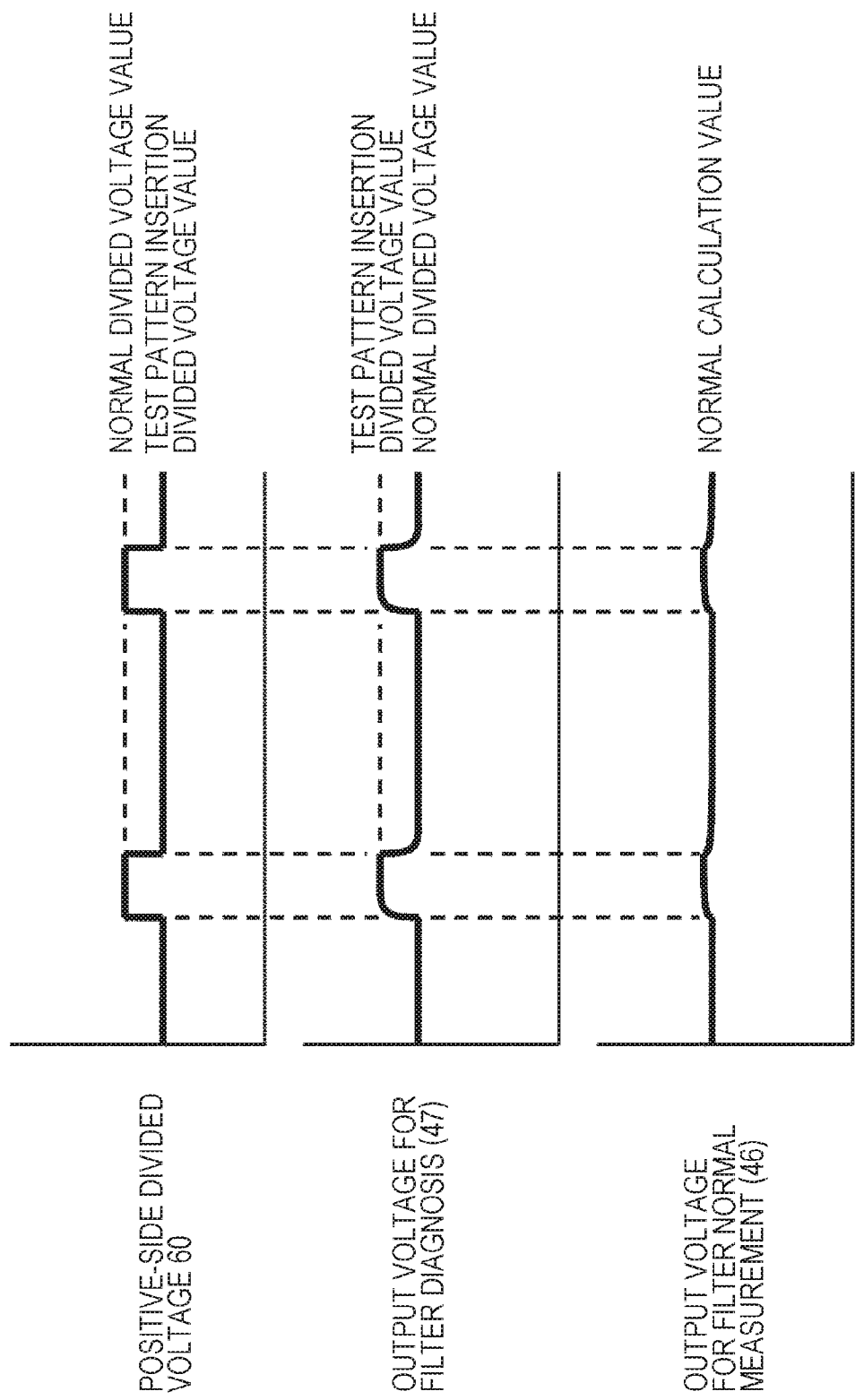

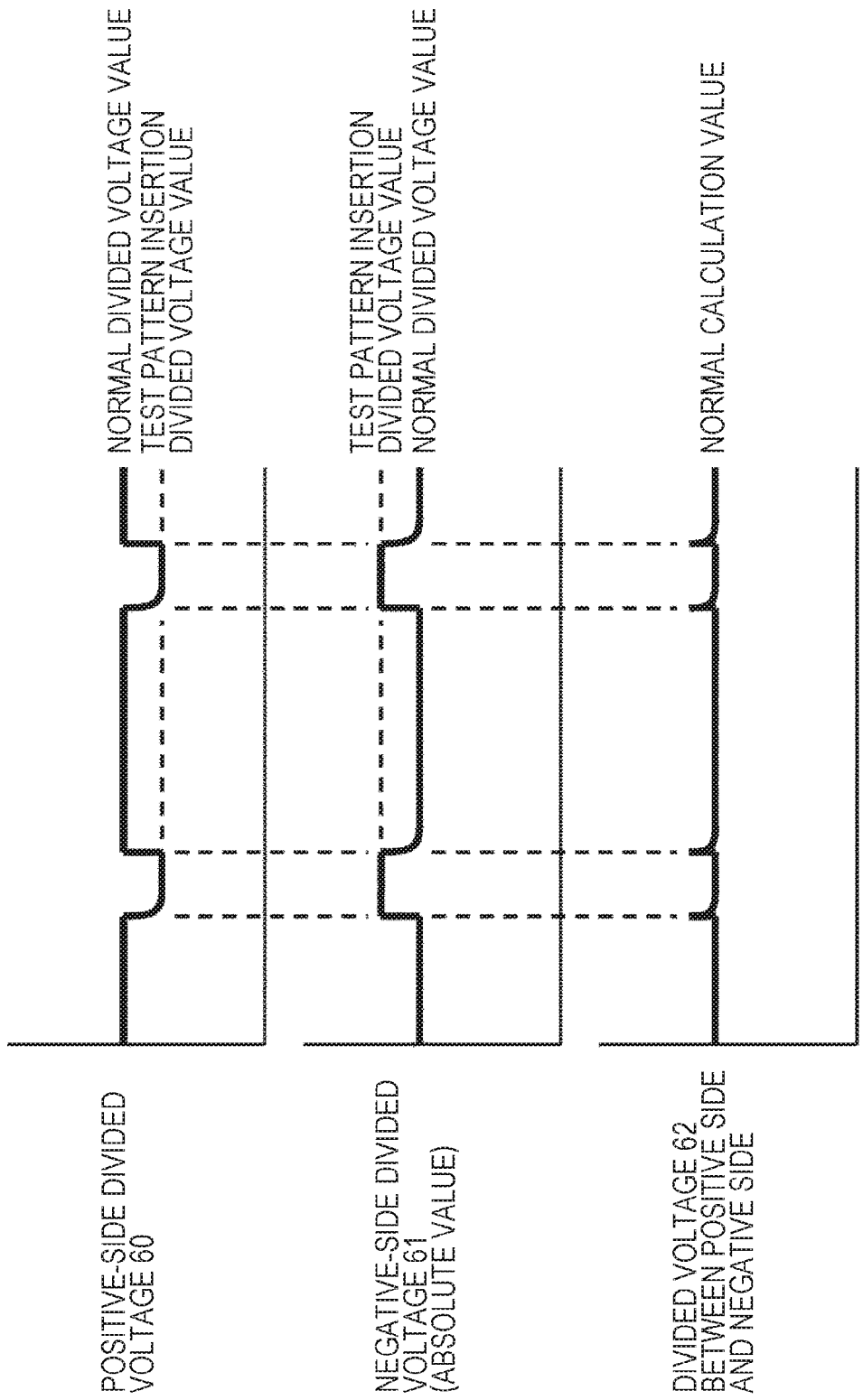

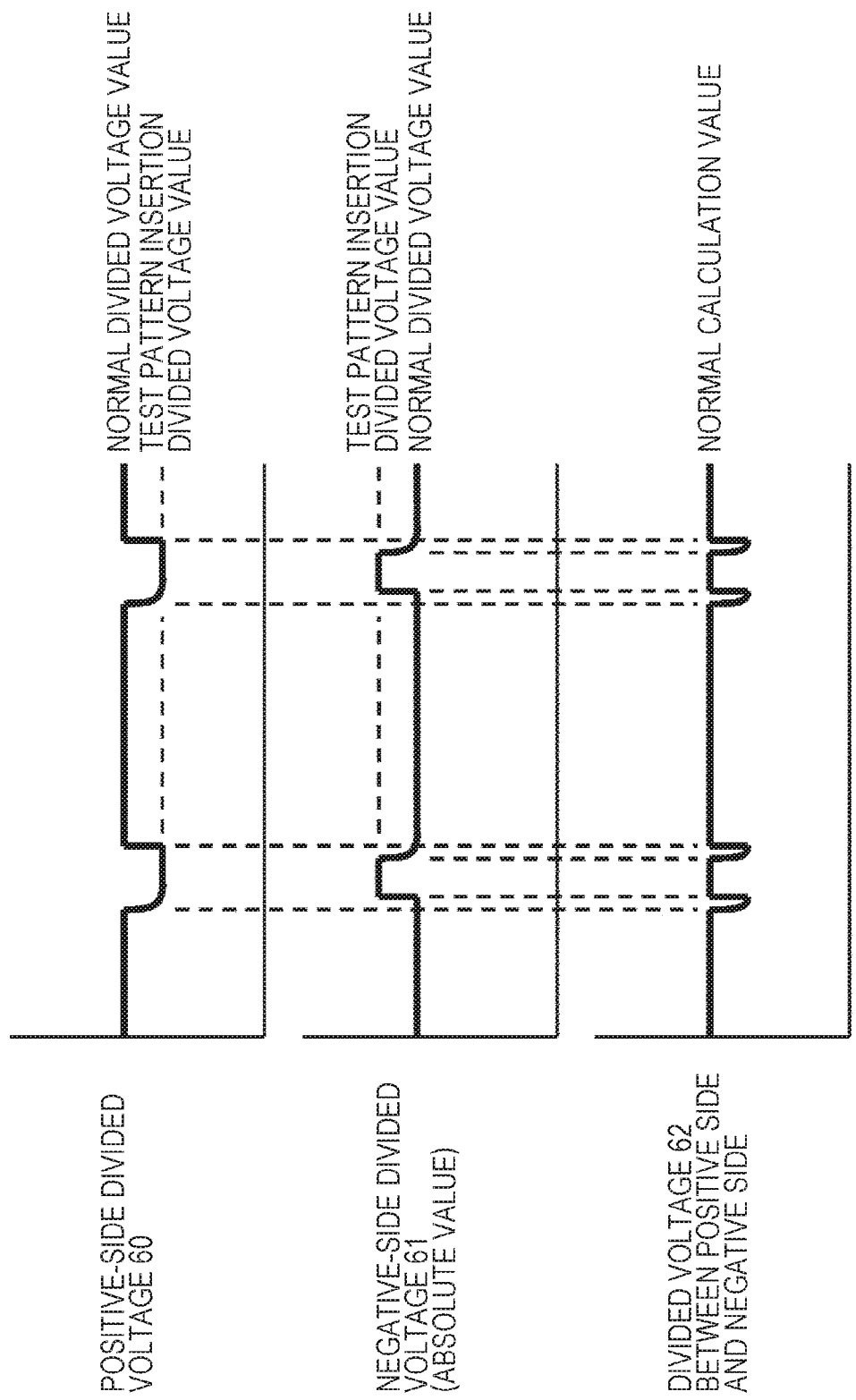

VOLTAGE DETECTION APPARATUS

TECHNICAL FIELD

The present invention relates to a voltage detection apparatus specifically detecting high DC voltage.

BACKGROUND ART

A power conversion apparatus has a power conversion function of converting DC power supplied from a DC power supply into AC power to be supplied to an AC electric load such as a rotating electric machine or converting AC power generated by the rotating electric machine into DC power to be supplied to the DC power supply. To fulfill this power conversion function, the power conversion apparatus includes an inverter circuit having a switching device. The switching device repeats a conduction operation and an interruption operation to perform power conversion from DC power to AC power or from AC power to DC power.

For power control for power conversion, a voltage value on a DC power supply side needs to be detected, and a function of measuring the voltage value is generally incorporated in the power conversion apparatus. Meanwhile, commands for power control are calculated by a low-voltage control circuit insulated from a high-voltage target for control.

In a conventional high DC voltage detection method, voltage dividers are connected in series in a multistage manner to convert voltage into one that can be measured in the low-voltage control circuit. In a case in which a resistance value changes due to deterioration or the like of a resistor caused by surges, divided voltage also changes, and accurate measurement cannot be performed. In a case in which accurate high DC voltage detection cannot be performed, this may cause motor control to be unstable and may cause failures of a power module and a capacitor module. Thus, a function of diagnosing abnormalities of the voltage divider is preferably provided.

As an abnormality diagnosis method for a high DC voltage detection circuit, a technique of calculating an estimated fluctuation value of a DC voltage value from a current measurement value in a current sensor and comparing the value with an actual DC voltage measurement value is known (for example, refer to PTL 1). However, in this method, it is difficult, to determine which part of the high DC voltage detection circuit fails, and it is difficult to let a failure part perform a backup operation appropriately.

CITATION LIST

Patent Literature

PTL 1: JP 2005-117756 A

SUMMARY OF INVENTION

Technical Problem

An object to be achieved by the present invention is to diagnose a state of a voltage divider while performing a normal measurement to improve reliability.

Solution to Problem

In order to solve the above issue, a voltage detection apparatus according to the present invention includes: a first resistor for dividing voltage of a detection unit into a first divided voltage value; and a test pattern insertion circuit unit including a second resistor for dividing the first divided voltage value into a second divided voltage value and a switching device, wherein the test pattern insertion circuit unit is connected to an equipotential connection point to the first divided voltage value, and wherein a state of the first resistor is detected based on the second divided voltage value when the switching device is conductive.

Advantageous Effects of Invention

According to the present invention, a state of a voltage divider can be diagnosed, and reliability can be improved.

BRIEF DESCRIPTION OF DRAWINGS

FIG. 7 is a fifth waveform chart in a case in which the test pattern insertion circuits 510 and 511 are operated.

FIG. 10 is a third waveform chart in a case in which the test pattern insertion circuits 510 and 511 are operated.

FIG. 11 is a fourth waveform chart in a case in which the test pattern insertion circuits 510 and 511 are operated.

DESCRIPTION OF EMBODIMENTS

Hereinbelow, an embodiment of the present invention will be described with reference to the drawings.

Figure 1:
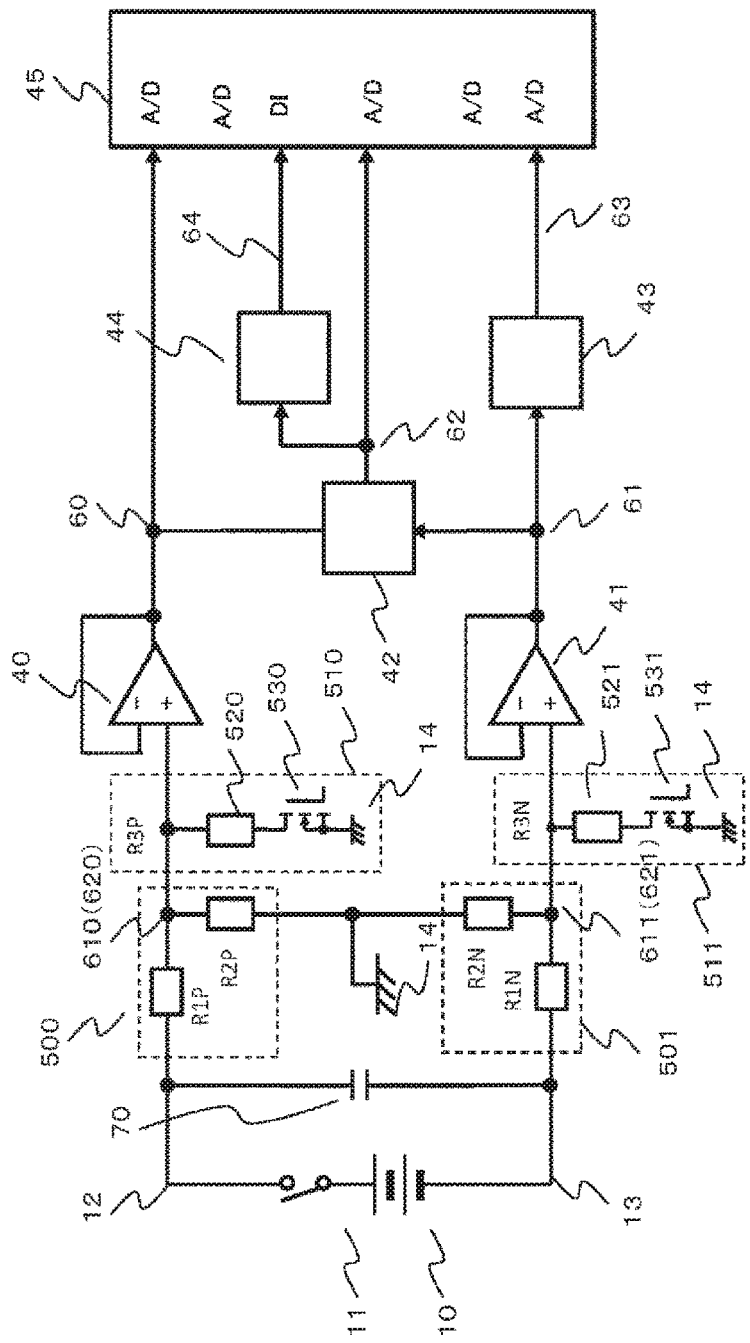
FIG. 1 is a circuit block diagram of a voltage detection apparatus including a test pattern insertion circuit 510 according to the present embodiment.

FIG. 1 is a circuit block diagram of a voltage detection apparatus including a test pattern insertion circuit 510 according to the present embodiment.

A DC power supply 10 is connected to a DC side of a power conversion apparatus. The DC power supply 10 supplies power in a case in which the power conversion apparatus drives an AC electric load and is charged via the power conversion apparatus in a case in which the AC electric load generates power.

An interruption unit 11 is inserted between the DC power supply 10 and the power conversion apparatus and interrupts connection between the DC power supply 10 and the power conversion apparatus at the time of a system stop or abnormality.

A capacitor module 70 is connected to the DC side of the power conversion apparatus and is configured to smooth DC voltage fluctuation generated by operations of the power conversion apparatus.

Detection target electric potential (positive side) 12 is positive electric potential of a high DC voltage unit of an inverter. A first divided voltage value 610 is voltage obtained by dividing the detection target electric potential 12 by means of a first resistor 500. The first divided voltage value 610 illustrated in FIG. 1 is voltage in a state in which a switching device 530 is not conductive.

A second divided voltage value 620 is voltage obtained by dividing the detection target electric potential 12 by means of the first resistor 500 and a second resistor 520. The second divided voltage value 620 illustrated in FIG. 1 is voltage in a state in which the switching device 530 is conductive.

Case electric potential 14 is (chassis) electric potential serving as a reference for a control circuit (not illustrated), which is a calculation unit constituted by a microcomputer or the like.

The first resistor 500 is a voltage dividing resistor for dividing the detection target electric potential 12 into the first divided voltage value 610 with reference to the case electric potential 14.

The second resistor 520 forms a combined voltage dividing resistor with the first resistor 500 in a case in which the first resistor 500 is diagnosed. The second resistor 520 is also a resistor for dividing the detection target electric potential. 12 into the second divided voltage value 620 with reference to the case electric potential 14 by forming the combined voltage dividing resistor with the first resistor 500.

The switching device 530 is a switch for combining the first resistor 500 with the second resistor 520 when the switching device 530 gets conductive for diagnosing the first resistor 500.

The test pattern insertion circuit 510 includes the second resistor 520 and the switching device 530. The test pattern insertion circuit 510 causes the switching device 530 to get conductive to combine the first resistor 500 with the second resistor 520 for diagnosing the first resistor 500. The test pattern insertion circuit 510 is also a circuit for generating the second divided voltage value 620 by combining the first resistor 500 with the second resistor 520.

The same is true of detection target electric potential (negative side) 13, a first resistor 501, a test pattern Insertion circuit 511, a second resistor 521, a switching device 531, a first divided voltage value 611, and a second divided voltage value 621.

A buffer 40 is a voltage follower for supplying the first divided voltage value 610 or the second divided voltage value 620 on the positive side to a calculation circuit 42 and a microcomputer 45 as positive-side divided voltage 60.

A buffer 41 is a voltage follower for supplying the first divided voltage value 611 or the second divided voltage value 621 on the negative side to the calculation circuit 42 and a calculation circuit 43 as negative-side divided voltage 61.

The calculation circuit 43 inverts, with reference to the case electric potential 14, the negative-side divided voltage 61 which is negative voltage with respect to the case electric potential 14, and outputs a negative voltage inversion detection signal 63.

The calculation circuit 42 derives a differential between the positive-side divided voltage 60 and the negative-side divided voltage 61 to calculate divided voltage 62 of high DC voltage between the positive side and the negative side.

The calculation circuit 44 performs overvoltage determination for the divided voltage 62 between the positive side and the negative side based on a preset overvoltage threshold value and outputs an overvoltage detection signal 64.

To the microcomputer 45, the positive-side divided voltage 60 of the high DC voltage is directly input into an A/D conversion port thereof, a calculation result of the calculation circuit 42, that is, the divided voltage 62 between the positive side and the negative side is input into an A/D conversion port thereof, and a calculation result of the calculation circuit 43, that is, the negative voltage inversion detection signal 63 is input into an A/D conversion port thereof.

The microcomputer 45 generates a control signal for power conversion based on each input calculation result and detects leakage of the high DC voltage into the case. Also, the calculation result of the calculation circuit 44, that is, the overvoltage detection signal 64 is input into a general-purpose digital port of the microcomputer 45. In a case in which overvoltage is detected, the microcomputer 45 controls the control signal to stop the power conversion operation.

The micro computer 45 also gives a command of switching a conduction state of the switching device 530 or the switching device 531 from a general-purpose digital output port (not illustrated).

Figure 6A:
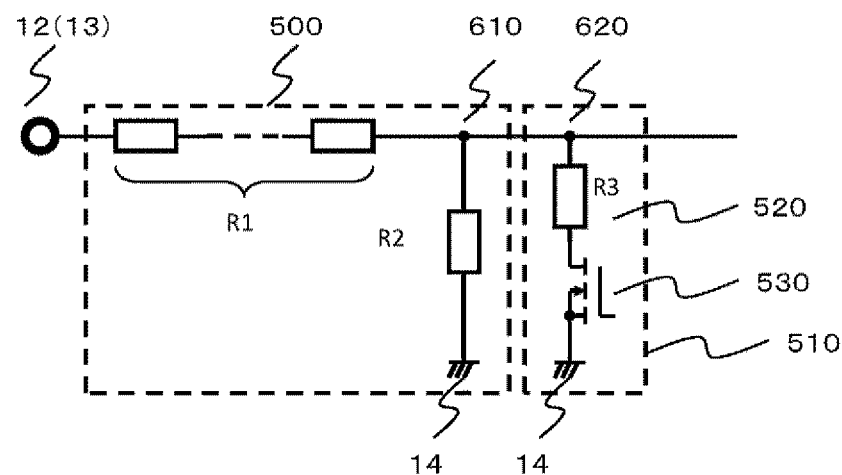
FIG. 6A illustrates a configuration of the test pattern insertion circuit 510 according to the present embodiment arranged in parallel with a case electric potential side of a first resistor 500.

FIG. 6(a) illustrates a configuration of the test pattern insertion circuit 510 according to the present embodiment arranged in parallel with the case electric potential side of the first resistor 500.

The first resistor 500 is a voltage dividing resistor for dividing the detection target electric potential 12 into the first divided voltage value 610 with reference to the reference electric potential 14. The first divided voltage value 610 is input into an A/D converter incorporated in the microcomputer 45 for controlling a motor and is used as a control constant for controlling the motor.

The test pattern insertion circuit 510 includes the second resistor 520 and the switching device 530, causes the switching device 530 to get conductive to combine the first resistor 500 with the second resistor 520, and generates the second divided voltage value 620.

In a case in which the switching device 530 is not conductive, only the first resistor 500 is a resistor that divides the detection target electric potential 12, and divided voltage is the first divided voltage value 610. Hereinbelow, a state in which the switching device 530 is conductive is a diagnosis state while a state in which the switching device 530 is not conductive is a non-diagnosis state.

According to the present embodiment, a ratio between the first divided voltage value 610 and the second divided voltage value 620 in a normal state can be calculated uniquely from a resistance value of the first resistor 500 and a resistance value of the second resistor 520. In a case in which an abnormality occurs in the resistance value of the first resistor 500, the ratio between the first divided voltage value 610 and the second divided voltage value 620 becomes a different value from the ratio between the first divided voltage value 610 and the second divided voltage value 620 in the normal state (refer to Equation 1 and Equation 2).

When switching device 530 is not conductive: $R2/(R1+R2)$     (Equation 1)

When switching device 530 is conductive: (R2//R3)/
(R1+R2//R3)  (Equation 2)

The first divided voltage value 610 and the second divided voltage value 620 are input into the A/D converter of the microcomputer to calculate the ratio. In a case in which this ratio differs from the ratio determined by the resistance value of the first resistor 500 and the resistance value of the second resistor 520, the first resistor 500 can be determined as being abnormal. (Alternatively, the second divided voltage value 620 may be estimated based on the first divided voltage value 610 and may be compared with a measured second divided voltage value 620.)

Accordingly, a resistance value abnormality of the first resistor 500 can be diagnosed, and measurement reliability of the voltage detection apparatus is improved.

Meanwhile, the buffer circuit unit 40 illustrated in FIG. 1 is a circuit for separating a voltage dividing circuit including the first resistor 500 and the second resistor 520 from the downstream calculation circuit 40 and microcomputer 45. In a case in which input impedance of the buffer circuit unit 40 is negligibly higher than a resistance value of the voltage dividing circuit, the divided voltage value can be calculated only with a circuit constant in the upstream of the buffer circuit unit 40 regardless of the circuit in the downstream of the buffer circuit unit 40. By arranging the test pattern insertion circuit 510 in the upstream of the buffer circuit unit 40, the combined resistor of the first resistor 500 and the second resistor 520 is formed, and a resistance value abnormality of the first resistor 500 can be diagnosed by the aforementioned method.

In general, the divided voltage 62 of the high DC voltage between the positive side and the negative side is used as a parameter for driving the AC electric load, and the positive-side divided voltage 60 of the high DC voltage and the negative voltage inversion detection signal 63 are used for a diagnosis such as detection of leakage of the high DC voltage into the case. Hereinbelow, a method for diagnosing a state of the voltage divider without influencing the divided voltage 60 between the positive side and the negative side will be described.

In the configuration illustrated in FIG. 1, R1P=R1N=R1, R2P=R2N=R2, R3P=R3N=R3, and gain of each of the buffer circuits 40 and 41 and the calculation circuit 42 shall be 1. Also, on-resistance in a state in which the switching devices 530 and 531 are conductive, leakage current in which the switching devices 530 and 531 are not conductive, and leakage current of the buffers 40 and 41 and the calculation circuit 42 shall be ignored. In addition, leakage not resulting from the present configuration shall not be generated between the high DC voltage and the case electric potential. In a case in which the switching device 530 is conductive and in which the switching device 531 is not conductive, a ratio K0 between the high DC voltage 10 and the divided voltage 62 between the positive side and the negative side is expressed by Equation 3.

$$K0 = \frac{R2 \cdot (R2 + 2 \cdot R3)}{(R1+R2) \cdot (R2+R3) + R1 \cdot R2 + R2 \cdot R3 + R3 \cdot R1}$$ (Equation 3)

Here, when R1>>R2, and R1>>R3, that is, when a relative difference between the case electric potential 14 and the electric potential of the high DC voltage is considered to be sufficiently small even in a case in which the states of the switching devices 530 and 630 are changed, a ratio K1 between the high DC voltage 10 and the positive-side divided voltage 60 is expressed by Equation 4, and a ratio K2 between the high DC voltage 10 and the negative-side divided voltage 61 is expressed by Equation 5.

$$K1 = \frac{1}{2} \cdot \frac{R2 // R3}{R1 + R2 // R3}$$ (Equation 4)

$$K2 = \frac{1}{2} \cdot \frac{R2}{R1 + R2}$$ (Equation 5)

On the other hand, in a case in which the switching device 530 is not conductive and in which the switching device 531 is conductive, a ratio between the high DC voltage 10 and the positive-side divided voltage 60 is K2, and a ratio between the high DC voltage 10 and the negative-side divided voltage 61 is K1.

Even when the setting in which one of the switching devices 530 and 531 is conductive and in which the other is not conductive is reversed, the divided voltage 62 between the positive side and the negative side is always equal to K1+K2. Thus, this does not influence driving of the AC electric load.

Also, since the ratios K1 and K2 are determined uniquely by the circuit constant, checking by means of the microcomputer 45 if the fluctuation of the positive-side divided voltage 60 caused by switching of the state of the switching device 530 complies with the ratio is a diagnosis of the first resistor 500. Similarly, observing the voltage fluctuation of the negative-side inversion detection signal 63 caused by switching of the state of the switching device 531 enables a diagnosis of the second resistor.

K0=K1+K2 is established under the conditions of R1>>R2 and R1>>R3. However, strictly speaking, this is not true. Depending on the use conditions, the correlation between the high DC voltage 10 and the case electric potential 14 needs to be considered with care.

Figure 8:
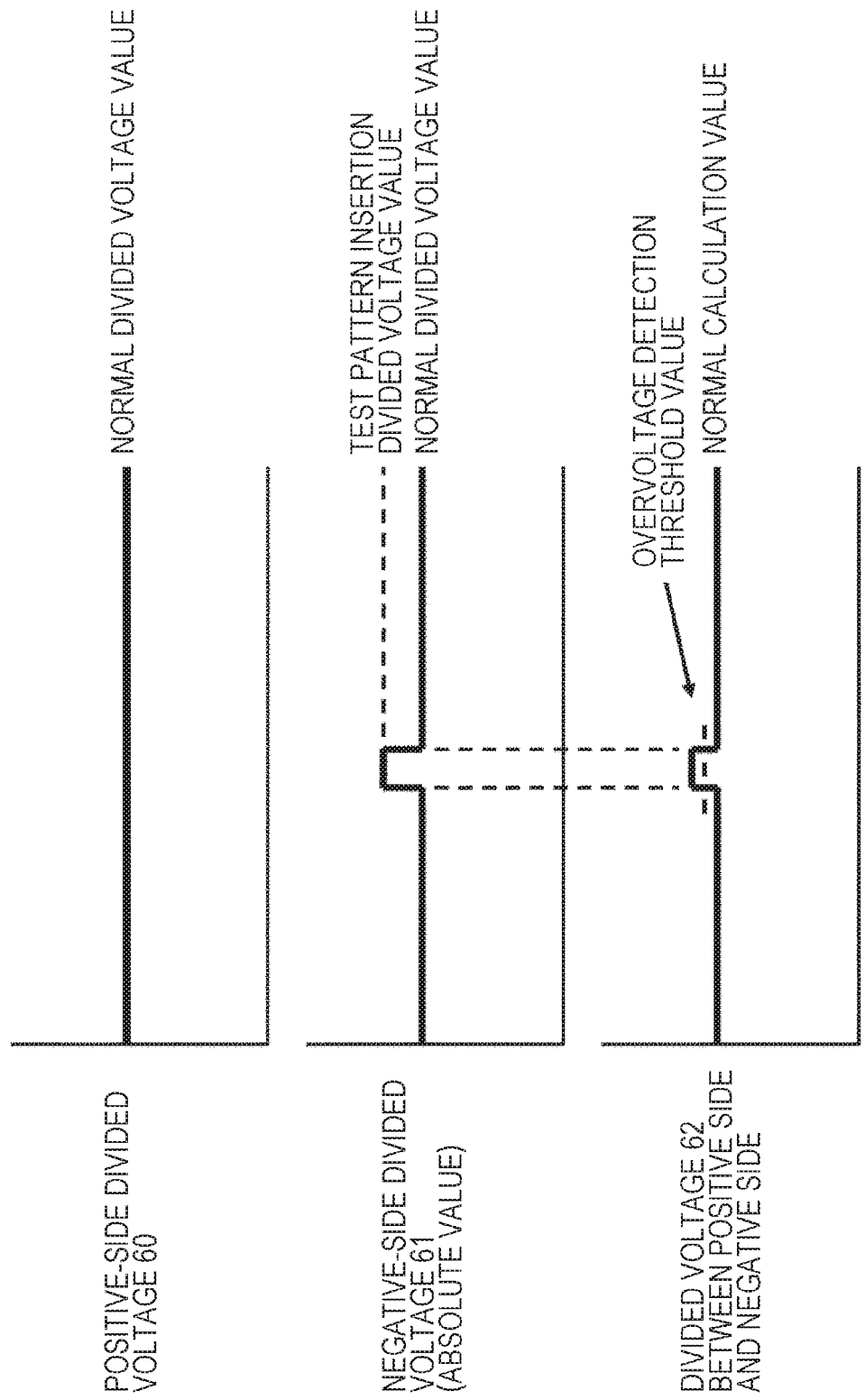
FIG. 8 is a first waveform chart in a case in which the test pattern insertion circuits 510 and 511 are operated.

FIG. 8 is a first waveform chart in a case in which the test pattern insertion circuits 510 and 511 are operated. An upper waveform in FIG. 8 is a waveform of the positive-side divided voltage 60 illustrated in FIG. 1, and a normal divided voltage value in this waveform is a voltage value when the switching device 530 is in the conductive state. A middle waveform in FIG. 8 is a waveform of the negative-side divided voltage 61 illustrated in FIG. 1, and a normal divided voltage value in this waveform is a voltage value when the switching device 531 is in the conductive state. A lower waveform in FIG. 8 is a combined waveform of the upper waveform and the middle waveform in FIG. 8.

The calculation circuits 42 to 44 and the microcomputer 45 are circuits for detecting overvoltage by comparing voltage measured in the voltage detection circuit with a pre-set arbitrary overvoltage detection threshold value. By changing the voltage division ratio (or supplying predetermined voltage) by means of the test pattern insertion circuits 510 and 511, the measured voltage can reach an overvoltage detection level even in a case in which the actual voltage (normal divided voltage value) does not reach the overvoltage detection level. Accordingly, it is possible to check if the overvoltage detection circuit is operated normally without actually bringing an overvoltage state.

Figure 9:
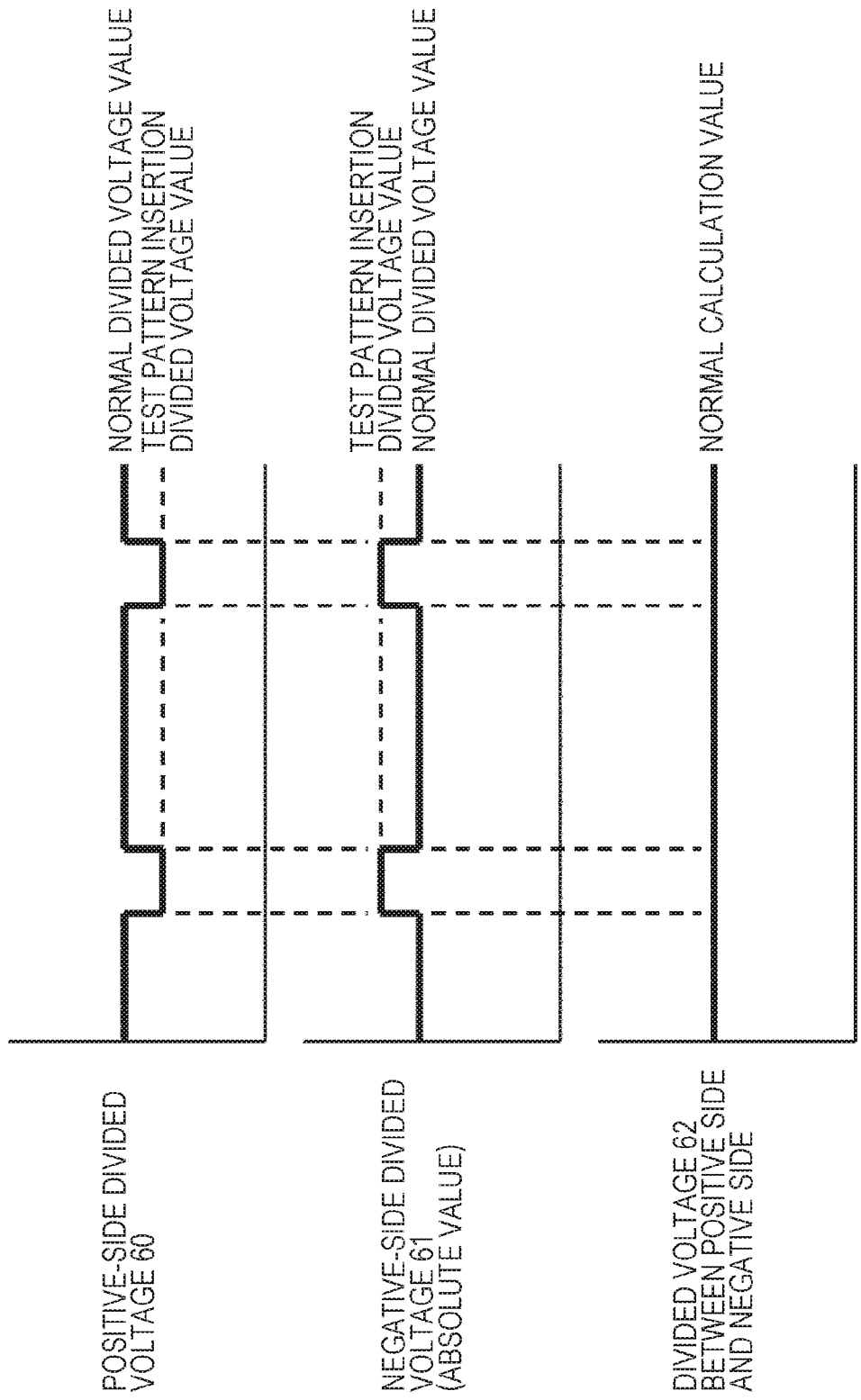
FIG. 9 is a second waveform chart in a case in which the test pattern insertion circuits 510 and 511 are operated.

FIG. 9 is a second waveform chart in a case in which the test pattern insertion circuits 510 and 511 are operated.

A first test pattern circuit unit is connected to a circuit for dividing voltage between the positive side of the high DC voltage and the reference electric potential to change a divided voltage value of the positive-side detection circuit.

A second test pattern circuit unit is connected to a circuit for dividing potential between the negative side of the high DC voltage and the reference electric potential to change a divided voltage value of the negative-side detection circuit.

For example, when the first test pattern circuit unit changes an absolute value of a divided voltage value of the positive-side detection circuit to be lower, the second test pattern circuit unit changes an absolute value of a divided voltage value of the negative-side detection circuit to be higher. By setting the resistance value of the first test pattern circuit and the resistance value of the second test pattern circuit so that the change amount may be equal, a differential calculation value between the positive-side detection result and the negative-side detection result at the time of test pattern insertion is equal to that before test pattern insertion, which enables a diagnosis that does not influence the differential calculation result.

FIG. 10 is a third waveform chart in a case in which the test pattern insertion circuits 510 and 511 are operated. FIG. 11 is a fourth waveform chart in a case in which the test pattern insertion circuits 510 and 511 are operated.

After the elapse of as long time as operation delay from insertion of a test pattern from the first test pattern circuit to reflection of the insertion of the test pattern from the first test pattern circuit in a divided voltage value, a test pattern is inserted from the second test pattern circuit, and after the elapse of as long time as operation delay from release of the insertion of the test pattern from the second test pattern circuit to reflection of the release of the insertion of the test pattern from the second test pattern circuit in a divided voltage value, the test pattern from the first test pattern circuit is released.

By doing so, it is possible to restrict the differential calculation value from becoming a high value due to a change of an output of the insertion circuit for increasing the absolute value of the divided voltage value before completion of a change of an output of the insertion circuit for decreasing the absolute value of the divided voltage value, and it is possible to prevent erroneous overvoltage detection by means of test pattern insertion.

Figure 2:
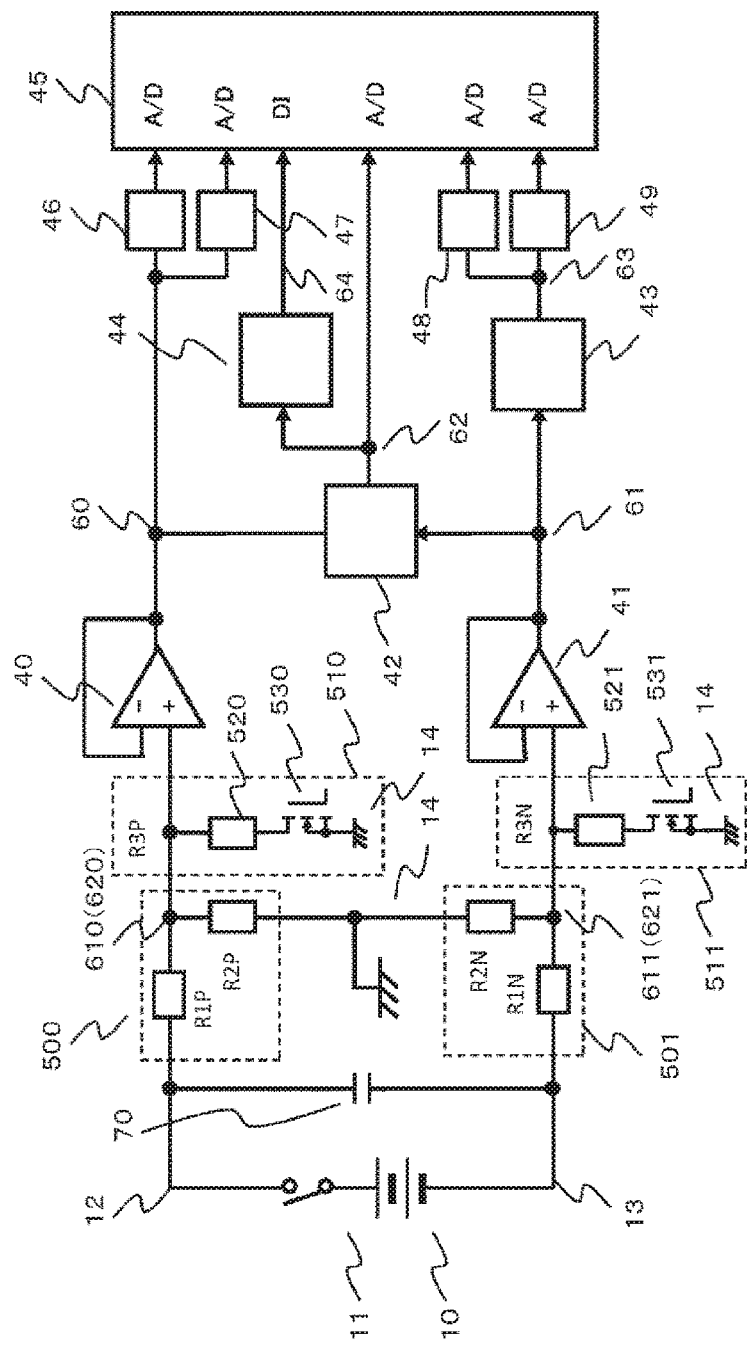
FIG. 2 is a circuit block diagram of the voltage detection apparatus including the test pattern insertion circuit 510 according to another embodiment.

FIG. 2 is a circuit block diagram of the voltage detection apparatus including the test pattern insertion circuit 510 according to another embodiment. Since components shown with the same reference signs as those in FIG. 1 have similar functions, description of the duplicate components is omitted.

A filter circuit 46 eliminates from the positive-side divided voltage 60 a high-frequency component generated by the test pattern insertion circuit 510 and supplies the positive-side divided voltage 60 to the microcomputer 45. A filter circuit 47 allows the positive-side divided voltage 60 fluctuated by the test pattern insertion circuit 510 to pass therethrough, eliminates a higher-frequency component than the fluctuated positive-side divided voltage 60, and supplies the fluctuated positive-side divided voltage 60 to the microcomputer 45.

A filter circuit 48 eliminates from the negative voltage inversion detection signal 63 a high-frequency component generated by the test pattern insertion circuit 610 and supplies the negative voltage inversion detection signal 63 to the microcomputer 45. A filter circuit 49 allows the negative voltage inversion detection signal 63 fluctuated by the test pattern insertion circuit 610 to pass therethrough, eliminates a higher-frequency component than the fluctuated negative voltage inversion detection signal 63, and supplies the fluctuated negative voltage inversion detection signal 63 to the microcomputer 45.

FIG. 7 is a fifth waveform chart in a case in which the test pattern insertion circuits 510 and 511 are operated. The first filter circuit 46 is a filter circuit setting a filter constant in which pulses inserted from the test pattern insertion circuit 510 attenuate in a state of not being detected in the downstream microcomputer 45 (or calculation circuits 42 to 44).

The second filter circuit 47 is a filter circuit setting a filter constant in which pulses inserted from the test pattern insertion circuit 510 are allowed to pass therethrough in a detectable state in the downstream microcomputer (or calculation circuits).

Accordingly, when a test pattern is inserted, a value which is the same as one in a case in which no test pattern is inserted and a value which has changed by the insertion can be measured at the same time.

Figure 3:
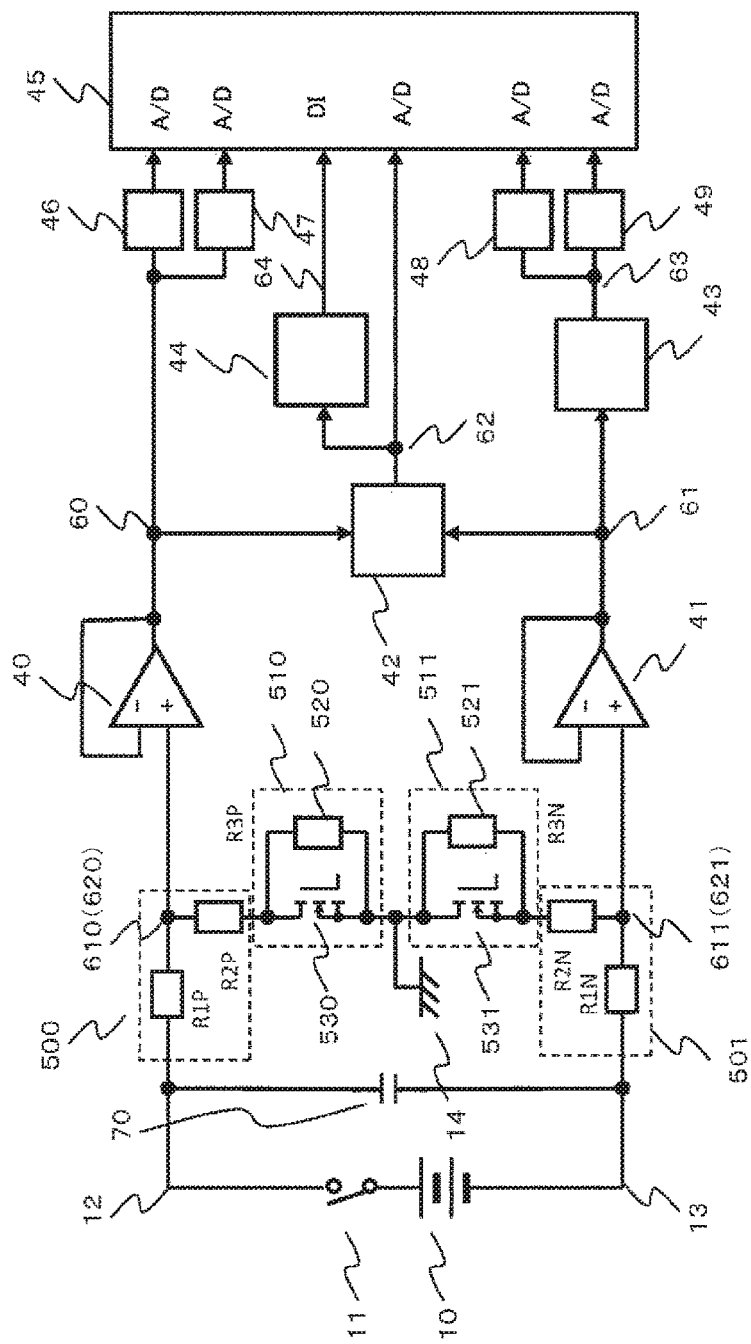
FIG. 3 is a circuit block diagram of the voltage detection apparatus including the test pattern insertion circuit 510 according to another embodiment.

FIG. 3 is a circuit block diagram of the voltage detection apparatus including the test pattern insertion circuit 510 according to another embodiment.

The detection target electric potential (positive side) 12 is positive electric potential of the high DC voltage unit of the inverter. The first divided voltage value 610 is voltage obtained by dividing the detection target electric potential 12 by means of the first resistor 500. The first divided voltage value 610 in the configuration in FIG. 3 is voltage in a state in which the switching device 530 is conductive.

The second divided voltage value 620 is voltage obtained by dividing the detection target electric potential 12 by means of the first resistor 500 and the second resistor 520. The second divided voltage value 620 in the configuration in FIG. 3 as voltage in a state in which the switching device 530 is not conductive.

The case electric potential 14 is (chassis) electric potential serving as a reference for a control circuit. The first resistor 500 is a voltage dividing resistor for dividing the detection target electric potential 12 into the first divided voltage value 610 with reference to the case electric potential 14. The second resistor 520 forms a combined voltage dividing resistor with the first resistor 500 in a case in which the first resistor 500 is diagnosed. The second resistor 520 is also a resistor for dividing the detection target electric potential 12 into the second divided voltage value 620 with reference to the case electric potential 14 by forming the combined voltage dividing resistor with the first resistor 500.

The switching device 530 is a switch for combining the first resistor 500 with the second resistor 520 when the switching device 530 gets non-conductive for diagnosing the first resistor 500.

The test pattern insertion circuit 510 includes the second resistor 520 and the switching device 530. The test pattern insertion circuit 510 causes the switching device 530 to get non-conductive to combine the first resistor 500 with the second resistor 520 for diagnosing the first resistor 500. The test pattern insertion circuit 510 is also a circuit for generating the second divided voltage value 620 by combining the first resistor 500 with the second resistor 520. Meanwhile, the switching device 530 can be conductive for diagnosing the first resistor 500 and can be non-conductive for not diagnosing the first resistor 500.

The same is true of the detection target electric potential (negative side) 13, the first resistor 501, the test pattern insertion circuit 511, the second resistor 521, the switching device 531, the first divided voltage value 611, and the second divided voltage value 621.

In the configuration in FIG. 3, $R1P=R1N=R1$, $R2P=R2N=R2$, $R3P=R3N=R3$, and gain of each of the buffers 40 and and the calculation circuit 42 shall be 1. Also, on-resistance in a state in which the switching devices 530 and 531 are conductive, leakage current in which the switching devices 530 and 531 are not conductive, and leakage current of the buffers 40 and 41 and the calculation circuit 42 shall be ignored. In addition, leakage not resulting from the present configuration shall not be generated between the high DC voltage and the case electric potential. In a case in which the switching device 530 is conductive and in which the switching device 531 is not conductive, a ratio K3 between the high DC voltage 10 and the divided voltage 62 between the positive side and the negative side is expressed by Equation 6.

$$K3 = \frac{2 \cdot R2 + R3}{2 \cdot (R1 + R2) + R3} \quad \text{(Equation 6)}$$

Here, when R1>>R2, and R1>>R3, that is, when a relative difference between the case electric potential 14 and the electric potential of the high DC voltage is considered to be sufficiently small even in a case in which the states of the switching devices 530 and 531 are changed, a ratio K4 between the high DC voltage 10 and the positive-side divided voltage 60 is expressed by Equation 7, and a ratio K5 between the high DC voltage 10 and the negative-side divided voltage 61 is expressed by Equation 8.

$$K4 = \frac{1}{2} \cdot \frac{R2}{R1 + R2} \quad \text{(Equation 7)}$$

$$K5 = \frac{1}{2} \cdot \frac{R2 + R3}{R1 + R2 + R3} \quad \text{(Equation 8)}$$

On the other hand, in a case in which the switching device 530 is not conductive and in which the switching device 531 is conductive, a ratio between the high DC voltage 10 and the positive-side divided voltage 60 is K5, and a ratio between the high DC voltage 10 and the negative-side divided voltage 61 is K4.

Even when the setting in which one of the switching devices 530 and 531 is conductive and in which the other is not conductive is reversed, the divided voltage 62 between the positive side and the negative side is always equal to K4+K5. Thus, this does not influence driving of the AC electric load.

Also, since the ratios K4 and K5 are determined uniquely by the circuit constant, checking by means of the microcomputer 45 if the fluctuation of the positive-side divided voltage 60 caused by switching of the state of the switching device 530 complies with the ratio is a diagnosis of the first resistor 500. Similarly, observing the voltage fluctuation of the negative-side inversion detection signal 63 caused by switching of the state of the switching device 531 enables a diagnosis of the second resistor.

Figure 6B:
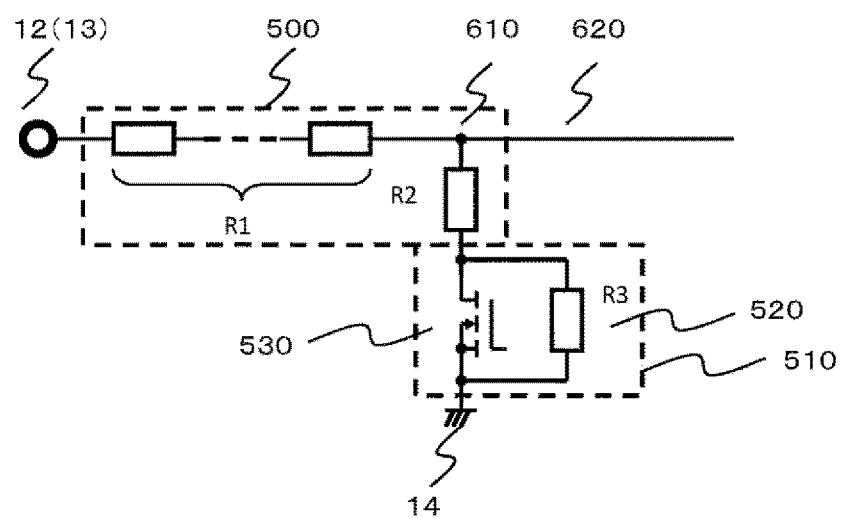
FIG. 6B illustrates a configuration of the test pattern insertion circuit 510 according to the present embodiment arranged in series with the case electric potential side of the first resistor 500.

FIG. 6(b) illustrates a configuration of the test pattern insertion circuit 510 according to the present embodiment arranged in series with the case electric potential side of the first resistor 500. Components shown with the same reference signs in FIG. 6(a) and FIG. 6(b) are circuit devices having the same functions.

According to the embodiment in FIG. 6(b), a ratio between the first divided voltage value 610 and the second divided voltage value 620 in a normal state can be calculated uniquely from a resistance value of the first resistor 500 and a resistance value of the second resistor 520. In a case in which an abnormality occurs in the resistance value of the first resistor 500, the ratio between the first divided voltage value 610 and the second divided voltage value 620 becomes a different value from the ratio between the first divided voltage value 610 and the second divided voltage value 620 in the normal state (refer to Equation 9 and Equation 10).

When switching device 530 is not conductive: (R2+R3)/(R1+R2+R3)     (Equation 9)

When switching device 530 is conductive: R2/(R1+R2)     (Equation 10)

The first divided voltage value 610 and the second divided voltage value 620 are input into the A/D converter of the microcomputer to calculate the ratio. In a case in which this ratio differs from the ratio determined by the resistance value of the first resistor 500 and the resistance value of the second resistor 520, the first resistor 500 can be determined as being abnormal.

Accordingly, a resistance value abnormality of the first resistor 500 can be diagnosed, and measurement reliability of the voltage detection apparatus is improved.

Figure 4:
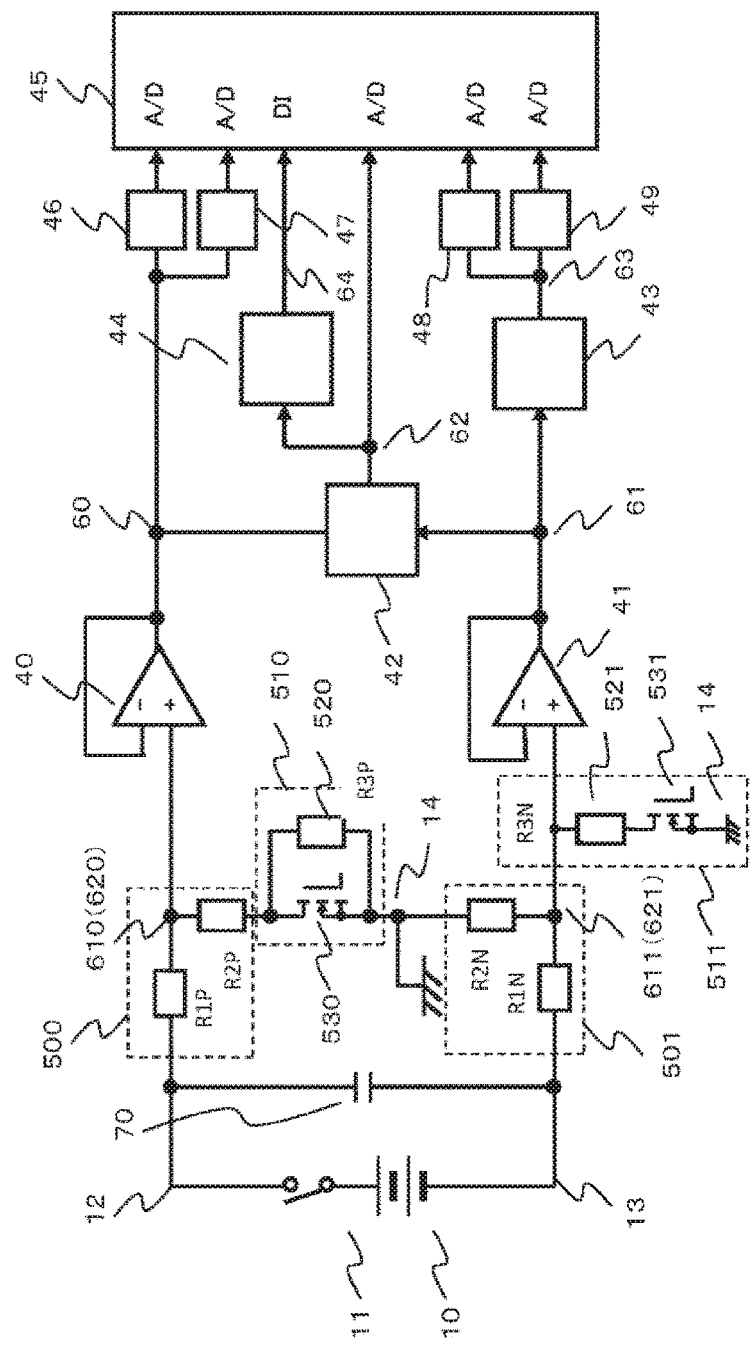
FIG. 4 is a circuit block diagram of the voltage detection apparatus including the test pattern insertion circuit 510 according to another embodiment.

FIG. 4 is a circuit block diagram of the voltage detection apparatus including the test pattern insertion circuit 510 according to another embodiment. In FIG. 4, operations of the switching device 530 are similar to those in FIG. 3, and operations of the switching device 531 are similar to those in FIGS. 1 and 2.

In the configuration in FIG. 4, R1P=R1N=R1, R2P=R2N=R2, and gain of each of the buffers 40 and 41 and the calculation circuit 42 shall be 1. Also, on-resistance in a state in which the switching devices 530 and 531 are conductive, leakage current in which the switching devices 530 and 531 are not conductive, and leakage current of the buffers 40 and 41 and the calculation circuit 42 shall be ignored. In addition, leakage not resulting from the present configuration shall not be generated between the high DC voltage and the case electric potential.

In a case in which the switching device 530 is conductive and in which the switching device 531 is not conductive in a normal case, a ratio K6 between the high DC voltage 10 and the divided voltage 62 between the positive side and the negative side is expressed by Equation 11.

$$K6 = \frac{R2}{R1 + R2} \quad \text{(Equation 11)}$$

Here, R1>>R2, R1>>R3P, and R1>>R3N shall be established. A condition for preventing the divided voltage 62 between the positive side and the negative side from changing when switching of the state of the switching device 530 from being conductive to being non-conductive and switching of the state of the switching device 531 from being conductive to being non-conductive are performed at the same time is given by Equation 12.

$$R3N = \frac{R2}{R3P} \cdot (R2 - R3P) \quad \text{(Equation 12)}$$

By determining the resistance values of R3P and R3N so that Equation 12 may be established, even in a case in which the state of the switching device 530 is switched from being conductive to being non-conductive, and in which the state of the switching device 531 is switched from being conductive to being non-conductive, the divided voltage 62 between the positive side and the negative side will not change, and the first resistor 500 on the positive side and the first resistor 501 on the negative side can be diagnosed without influencing driving of the AC electric load.

Figure 5:
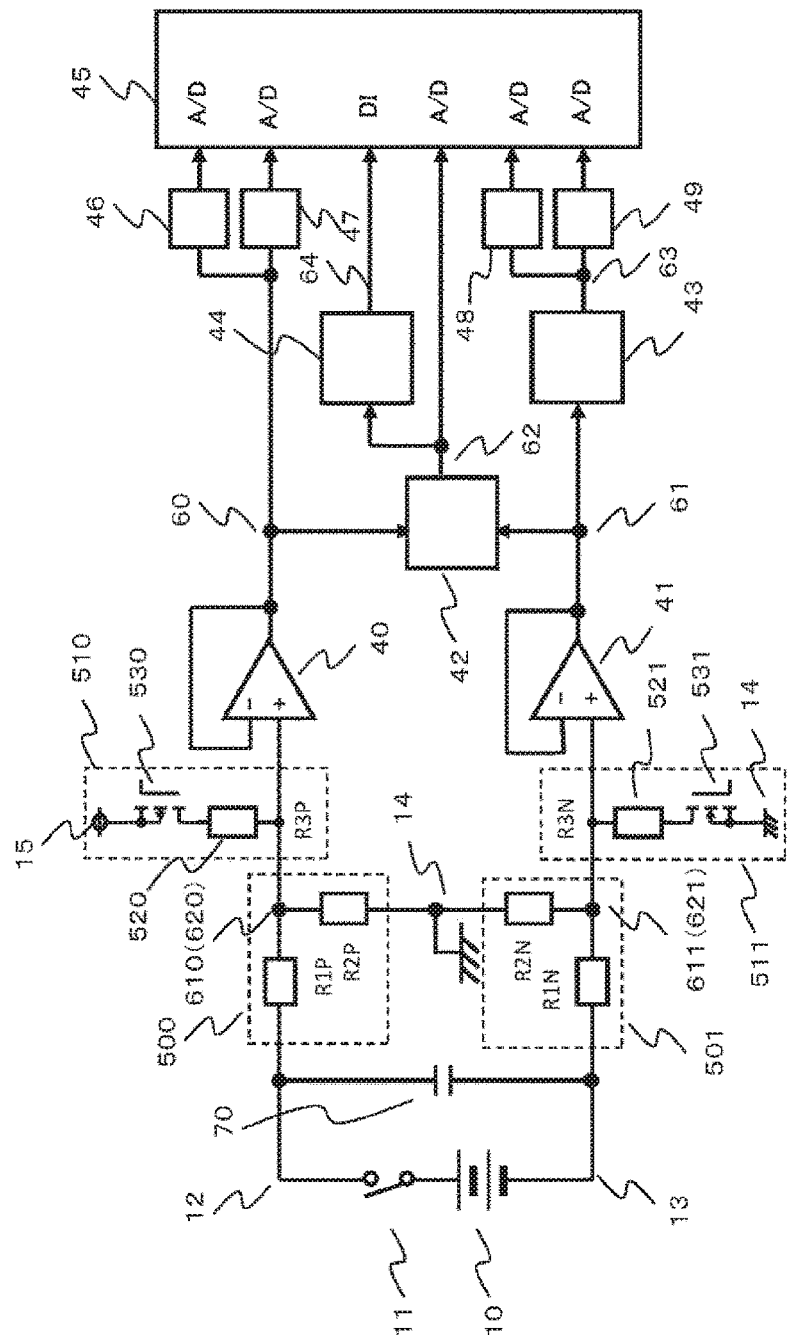
FIG. 5 is a circuit block diagram of the voltage detection apparatus including the test pattern insertion circuit 510 according to another embodiment.

FIG. 5 is a circuit block diagram of the voltage detection apparatus including the test pattern insertion circuit 510 according to another embodiment. Since components shown with the same reference signs as those in FIG. 2 have similar functions, description of the duplicate components is omitted.

FIG. 5 illustrates an example in which a connection destination of the positive-side test pattern insertion circuit 510 is not the case electric potential 14 but an arbitrary internal power supply. The switching device 530 is normally set to be non-conductive. When the switching device 530 is set to be conductive, voltage is supplied, and the positive-side divided voltage 60 can be increased. By doing so, the downstream buffer and calculation circuits can be diagnosed without applying the high DC voltage.

REFERENCE SIGNS LIST

10 DC power supply
11 interruption unit
12 detection target electric potential
13 detection target electric potential
14 case electric potential
15 arbitrary internal power supply
40 buffer circuit
41 buffer circuit
42 calculation circuit
43 calculation circuit
44 calculation circuit
45 microcomputer
46 filter circuit
47 filter circuit
48 filter circuit
49 filter circuit
60 positive-side divided voltage
61 negative-side divided voltage
62 divided voltage between positive side and negative side
63 negative voltage inversion detection signal
64 overvoltage detection signal
70 capacitor module
500 first resistor
501 first resistor
510 test pattern insertion circuit
511 test pattern insertion circuit
520 second resistor
521 second resistor
530 switching device
531 switching device
610 first divided voltage value
611 first divided voltage value
620 second divided voltage value
621 second divided voltage value

The invention claimed is:

1. A voltage detection apparatus comprising:
a first resistor for dividing voltage of a detection unit into a first divided voltage value; and
a test pattern insertion circuit unit including a second resistor for dividing the first divided voltage value into a second divided voltage value and a switching device, wherein
the test pattern insertion circuit unit is connected to an equipotential connection point to the first divided voltage value, and
a state of the first resistor is detected based on the second divided voltage value when the switching device is conductive,
the test pattern circuit unit includes a first test pattern circuit unit connected to a positive side of the detection unit and a second test pattern circuit unit connected to a negative side of the detection unit,
a first terminal of the first test pattern circuit unit is connected to an equipotential connection point to the first divided voltage value, and a second terminal of the first test pattern circuit unit is grounded,
a first terminal of the second test pattern circuit unit is connected to an equipotential connection point to the first divided voltage value, and a second terminal of the second test pattern circuit unit is grounded, and
the second test pattern circuit unit outputs a pulse having different polarity from that of a pulse of the first test pattern circuit unit.

2. The voltage detection apparatus according to claim 1, wherein the second resistor is electrically connected in series with the switching device.

3. The voltage detection apparatus according to claim 1, further comprising:
a buffer circuit unit for converting a detection signal including information about the state of the first resistor detected by the test pattern circuit unit; and
a calculation circuit unit for performing calculation based on a signal from the buffer circuit unit,
wherein the test pattern circuit unit is electrically connected on a side closer to the detection unit than the buffer circuit unit.

4. The voltage detection apparatus according to claim 3, further comprising:
a first filter circuit and a second filter circuit connecting the buffer circuit unit to the calculation circuit unit,
wherein the first filter circuit is provided to restrict the signal from the test pattern circuit unit, and
wherein the second filter circuit is configured to transmit the signal from the test pattern circuit unit to the calculation circuit unit.

5. The voltage detection apparatus according to claim 1, wherein the detection unit includes an overvoltage detection circuit unit for detecting overvoltage,
wherein a first terminal of the test pattern circuit unit is connected to an equipotential connection point to the first divided voltage value, and a second terminal of the test pattern circuit unit is connected to a power supply circuit unit, and
wherein the overvoltage detection circuit unit detects overvoltage based on a voltage value of the detection unit increased by the test pattern circuit unit.

6. The voltage detection apparatus according to claim 1, wherein the first test pattern circuit unit and the second test pattern circuit unit are operated so that a negative-side pulse may contain a positive-side pulse.

7. A voltage detection apparatus comprising:
a first resistor for dividing voltage of a detection unit into a first divided voltage value; and
a test pattern insertion circuit unit including a second resistor for dividing the first divided voltage value into a second divided voltage value and a switching device, wherein the test pattern insertion circuit unit is connected between the first resistor and reference electric potential, and a state of the first resistor is detected based on the second divided voltage value when the switching device is non-conductive, the test pattern circuit unit includes a first test pattern circuit unit connected to a positive side of the detection unit and a second test pattern circuit unit connected to a negative side of the detection unit, a first terminal of the first test pattern circuit unit is connected to an equipotential connection point to the first divided voltage value, and a second terminal of the first test pattern circuit unit is grounded, a first terminal of the second test pattern circuit unit is connected to an equipotential connection point to the first divided voltage value, and a second terminal of the second test pattern circuit unit is grounded, and the second test pattern circuit unit outputs a pulse having different polarity from that of a pulse of the first test pattern circuit unit.

8. The voltage detection apparatus according to claim 7, wherein the second resistor is electrically connected in parallel with the switching device.

9. A voltage detection apparatus comprising:

a first resistor for dividing voltage of a detection unit into a first divided voltage value; and a test pattern insertion circuit unit including a second resistor for dividing the first divided voltage value into a second divided voltage value and a switching device, a buffer circuit unit for converting a detection signal including information about the state of the first resistor detected by the test pattern circuit unit; and a calculation circuit unit for performing calculation based on a signal from the buffer circuit unit, a first filter circuit and a second filter circuit connecting the buffer circuit unit to the calculation circuit unit, wherein the test pattern insertion circuit unit is connected to an equipotential connection point to the first divided voltage value, and a state of the first resistor is detected based on the second divided voltage value when the switching device is conductive, the test pattern circuit unit is electrically connected on a side closer to the detection unit than the buffer circuit unit, the first filter circuit is provided to restrict the signal from the test pattern circuit unit, and the second filter circuit is configured to transmit the signal from the test pattern circuit unit to the calculation circuit unit.

* * * * *